(12) United States Patent
Cheng et al.

(10) Patent No.: US 12,262,567 B2
(45) Date of Patent: Mar. 25, 2025

(54) METHOD OF MANUFACTURING SEMICONDUCTOR STRUCTURE

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 445 days.

(21) Appl. No.: 17/771,747

(22) PCT Filed: Dec. 13, 2019

(86) PCT No.: PCT/CN2019/125113
§ 371 (c)(1),
(2) Date: Apr. 25, 2022

(87) PCT Pub. No.: WO2021/114222
PCT Pub. Date: Jun. 17, 2021

(65) Prior Publication Data
US 2022/0416114 A1 Dec. 29, 2022

(51) Int. Cl.
*H10H 20/01* (2025.01)
*H01L 21/263* (2006.01)
*H01L 21/461* (2006.01)

(52) U.S. Cl.
CPC ......... *H10H 20/01* (2025.01); *H01L 21/2633* (2013.01); *H01L 21/461* (2013.01)

(58) Field of Classification Search
None
See application file for complete search history.

(56) References Cited

U.S. PATENT DOCUMENTS

| | | | |
|---|---|---|---|
| 9,478,707 B2 | 10/2016 | Guenard | |
| 9,865,786 B2 | 1/2018 | Guenard | |

(Continued)

FOREIGN PATENT DOCUMENTS

| | | |
|---|---|---|
| CN | 102723416 A | 10/2012 |
| CN | 104396030 A | 3/2015 |

(Continued)

OTHER PUBLICATIONS

Machine Translation of KR-20090114870-A.*

(Continued)

*Primary Examiner* — Yara B Green
*Assistant Examiner* — Fakeha Sehar
(74) *Attorney, Agent, or Firm* — The Small Patent Law Group LLC; Christopher R. Carroll

(57) ABSTRACT

Provided is a method of manufacturing a semiconductor structure. The method includes: providing a substrate, where the substrate includes a plurality of component areas and peripheral areas surrounding the plurality of component areas; next, forming a sacrificial layer on each of the plurality of component areas, and forming a semiconductor active layer on the sacrificial layer and the substrate not covered with the sacrificial layer; patterning the semiconductor active layer to remove the semiconductor active layer on the peripheral areas so as to form a plurality of annular grooves which expose the sacrificial layer, such that the semiconductor active layer on each of the plurality of component areas is independent; afterwards, removing the sacrificial layer on each of the plurality of component areas through the annular grooves, such that the independent semiconductor active layer is separated from the substrate, where the independent semiconductor active layer forms a semiconductor structure.

10 Claims, 8 Drawing Sheets

(56) References Cited

U.S. PATENT DOCUMENTS

| | | | |
|---|---|---|---|
| 10,340,187 B2 | 7/2019 | Forrest et al. | |
| 2008/0038857 A1* | 2/2008 | Kim | H01L 21/0254 |
| | | | 438/46 |
| 2012/0018750 A1 | 1/2012 | Wang et al. | |
| 2014/0131729 A1* | 5/2014 | Heo | H10D 30/0295 |
| | | | 438/424 |
| 2015/0115290 A1 | 4/2015 | Guenard | |
| 2015/0318436 A1* | 11/2015 | Heo | H01L 33/20 |
| | | | 438/46 |
| 2017/0040518 A1 | 2/2017 | Guenard | |
| 2018/0047627 A1 | 2/2018 | Forrest et al. | |
| 2021/0336075 A1* | 10/2021 | Chen | H10H 20/018 |

FOREIGN PATENT DOCUMENTS

| | | | |
|---|---|---|---|
| CN | 107624197 A | | 1/2018 |
| CN | 109496368 A | | 3/2019 |
| KR | 20090114870 A | * | 11/2009 |

OTHER PUBLICATIONS

ISA State Intellectual Property Office of the People's Republic of China, International Search Report Issued in Application No. PCT/CN2019/125113, Sep. 16, 2020, WIPO, 4 pages.

ISA State Intellectual Property Office of the People's Republic of China, Written Opinion of the International Searching Authority Issued in Application No. PCT/CN2019/125113, Sep. 16, 2020, WIPO, 4 pages.(Submitted with Machine/Partial Translation).

* cited by examiner

METHOD OF MANUFACTURING SEMICONDUCTOR STRUCTURE

CROSS-REFERENCE TO RELATED APPLICATIONS

This application is a national stage entry of International Patent Application No. PCT/CN2019/125113 (filed 13 Dec. 2019), the entire disclosure of which is incorporated herein by reference.

TECHNICAL FIELD

The present disclosure relates to the field of semiconductor technologies, and in particular to a method of manufacturing a semiconductor structure.

BACKGROUND

Semiconductor substrates of III-nitride with GaN as a representative have drawn more and more attention of people because the III-nitride semiconductor structures can be widely applied to light-emitting diodes (LED) in semiconductor illumination, high power electronics and radiofrequency devices.

In the industry, GaN devices are generally manufactured on heterogeneous substrates such as sapphire, silicon carbide and silicon and then the heterogeneous substrates are peeled off by laser. In the laser lift-off technology, an interface between the GaN device and the heterogeneous substrate is irradiated by using laser of a particular wavelength, and the GaN material at the interface absorbs laser energy to decompose into Ga metal and nitrogen, thus separating the GaN device from the heterogeneous substrate.

However, the laser lift-off technology brings high costs. Further, the Ga metal can be easily oxidized to generate easily-attached gallium-based oxide, resulting in poor peeling quality; the GaN material may generate thermal stress when heated, so as to deteriorate its quality, thereby damaging the device.

In view of this, it is necessary to provide a new method of manufacturing a semiconductor structure to solve the above technical problem.

SUMMARY

The object of the present disclosure is to provide a method of manufacturing a semiconductor structure to improve peeling quality, avoid damaging the device and reduce costs.

In order to achieve the above purpose, the present disclosure provides a method of manufacturing a semiconductor structure. The method includes:
  providing a substrate, where the substrate includes a plurality of component areas and peripheral areas surrounding the plurality of component areas;
  forming a sacrificial layer on the substrate and patterning the sacrificial layer, such that the sacrificial layer on the plurality of component areas is at least remained;
  forming a semiconductor active layer on the remaining sacrificial layer and the substrate, and patterning the semiconductor active layer to remove the semiconductor active layer in the peripheral areas so as to form a plurality of annular grooves, such that the semiconductor active layer on each of the plurality of component areas is independent;
  removing the sacrificial layer on each of the plurality of component areas through the annular grooves, such that the independent semiconductor active layer on each of the plurality of component areas is separated from the substrate, where each independent semiconductor active layer forms a semiconductor structure.

Optionally, when the sacrificial layer is patterned, the remained sacrificial layer extends from the plurality of component areas to the peripheral areas; when the semiconductor active layer is patterned, the sacrificial layer on the peripheral areas is further removed, or the annular grooves expose the sacrificial layer on the peripheral areas.

Optionally, the sacrificial layer on the peripheral areas is removed by dry etch or wet etch.

Optionally, the sacrificial layer on the plurality of component areas is removed by dry etch or wet etch.

Optionally, the peripheral areas are connected together.

Optionally, forming the semiconductor active layer on the remaining sacrificial layer and the substrate includes: forming a transition layer on the remaining sacrificial layer and the substrate, and forming the semiconductor active layer on the transition layer; where when the semiconductor active layer is patterned, the transition layer is also patterned.

Optionally, before the semiconductor active layer is formed, high temperature annealing is performed for the transition layer to enable the transition layer to form a mono-crystalline material.

Optionally, a carrier plate is disposed on the semiconductor active layer on at least some of component areas prior to, or during or subsequent to the process of removing the sacrificial layers on the plurality of component areas.

Optionally, a cross section of the semiconductor active layer on each of the plurality of component areas is polygonal, and a cross section of the semiconductor active layer on each of the peripheral areas is a polygonal ring; or, the cross section of the semiconductor active layer on each of the plurality of component areas is circular or elliptical, and the cross section of the semiconductor active layer on each of the peripheral areas is correspondingly a circular ring or an elliptical ring.

Optionally, the semiconductor active layer includes a GaN-based material.

Optionally, the GaN-based material includes at least one of GaN, AlGaN or AlInGaN.

Optionally, a material of the transition layer includes at least one of AlN, SiAlN or AlGaN.

Optionally, a material of the sacrificial layer includes at least one of silicon dioxide, silicon nitride or silicon oxynitride.

Optionally, the semiconductor active layer includes a P type semiconductor layer, an N type semiconductor layer, and a light-emitting material layer disposed between the P type semiconductor layer and the N type semiconductor layer.

Compared with the prior art, the present disclosure has the following beneficial effects.

1) In the method of manufacturing a semiconductor structure according the present disclosure, a substrate is provided firstly, where the substrate includes a plurality of component areas and peripheral areas surrounding the plurality of component areas; next, a sacrificial layer is formed on each of the plurality of component areas, and a semiconductor active layer is formed on the sacrificial layer and the substrate not covered with the sacrificial layer; next, the semiconductor active layer is patterned to remove the semiconductor active layer on each of the peripheral areas so as to form a plurality of annular grooves which expose the sacrificial layer, such that the semiconductor active layer in each of the plurality of component areas is independent; afterwards, the sacrificial layer in each of the plurality of component area is removed through the annular grooves to separate the independent semiconductor active layer on each of the plurality of component areas from the substrate, where the independent semiconductor active layer forms a semiconductor structure. In the method, the sacrificial layer may be removed so as to manufacture a plurality of semiconductor structures at the same time. In this way, a large batch of semiconductor structures may be manufactured at the same time with lower costs. Furthermore, the material of the sacrificial layer is different from the material of the semiconductor active layer such that the substrate may be peeled off by removing the sacrificial layer, leading to good peeling quality. Further, there is no thermal process in the peeling process and thus the semiconductor active layer will not be damaged.

2) In an optional embodiment, when the sacrificial layer is patterned, the remaining sacrificial layer extends from the plurality of component area to the peripheral areas; when the semiconductor active layer is patterned, a) the sacrificial layer of each of the peripheral areas is further removed, or b) the annular grooves expose the sacrificial layer on the peripheral layers. In another optional embodiment, c) when the sacrificial layer is patterned, only the sacrificial layer on the plurality of component areas is remained; and when the semiconductor active layer is patterned to form the annular grooves, a side wall of the sacrificial layer on the plurality of component areas is exposed in the annular grooves. In the above three embodiments, the sacrificial layer on the plurality of component areas may be removed.

3) In an optional embodiment, the sacrificial layer on the peripheral areas is removed by dry etch or wet etch. The removal method of the sacrificial layer on the peripheral areas is not limited in the present disclosure.

4) In an optional embodiment, the sacrificial layer on the plurality of component area is removed by dry etch or wet etch. By using a dry etch gas or wet etch solution having a high etch selectivity for the sacrificial layer, it is guaranteed that the semiconductor active layer on the plurality of component areas will be protected against being damaged while the sacrificial layer is removed.

5) In an optional embodiment, forming the semiconductor active layer on the remaining sacrificial layer and the substrate includes: forming a transition layer on the remaining sacrificial layer and the substrate, and forming the semiconductor active layer on the transition layer; when the semiconductor active layer is patterned, the transition layer is also patterned. The transition layer may improve the quality of the growing semiconductor active layer.

6) In an optional embodiment, before the semiconductor active layer is formed, high temperature annealing is performed for the transition layer to enable the transition layer to form a mono-crystalline material. The mono-crystalline material helps to improve the quality of the semiconductor active layer formed thereon.

7) In an optional embodiment, the semiconductor active layer includes a P type semiconductor layer, an N type semiconductor layer and a light-emitting material layer disposed between the P type semiconductor layer and the N type semiconductor layer. The above semiconductor active layer forms an LED component. In other optional embodiments, the semiconductor active layer may also form another semiconductor structure, which is not limited in the present disclosure.

The manufacturing method according to the present disclosure is simple in operation and low in costs and can be applied to manufacture of elements with different size requirements, for example, to manufacture of an LED element of above 200 μm, or below 50 μm including LED elements of 2-15 μm.

Figure 1:
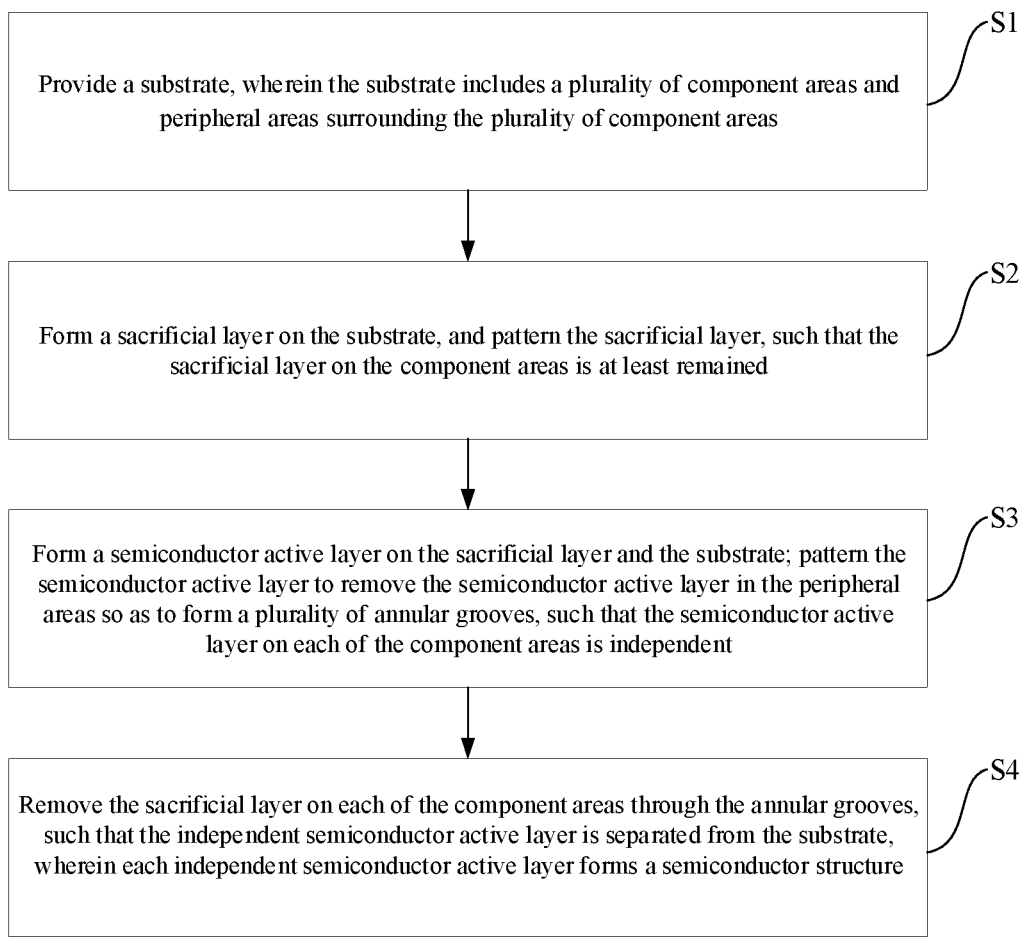
FIG. 1 is a flowchart illustrating a method of manufacturing a semiconductor structure according to a first embodiment of the present disclosure.

To help understanding of the present disclosure, all numerals of the drawings of the present disclosure are listed below:

substrate 10,
component area 10a,
peripheral area 10b,
sacrificial layer 11,
transition layer 12,
semiconductor active layer 13,
annular groove 14,
P type semiconductor layer 131,
N type semiconductor layer 132,
light-emitting material layer 133,
carrier plate 20, and
semiconductor structures 1, 2, 3.

DETAILED DESCRIPTION OF THE EMBODIMENTS

In order to make the above objects, features, and advantages of the present disclosure clearer and more understandable, the specific embodiments of the present disclosure will be detailed below in combination with the accompanying drawings.

FIG. 1 is a flowchart illustrating a method of manufacturing a semiconductor structure according to a first embodiment of the present disclosure. FIG. 2 to FIG. 8 are schematic diagrams illustrating intermediate structures corresponding to the flowchart of FIG. 1.

Figure 2:
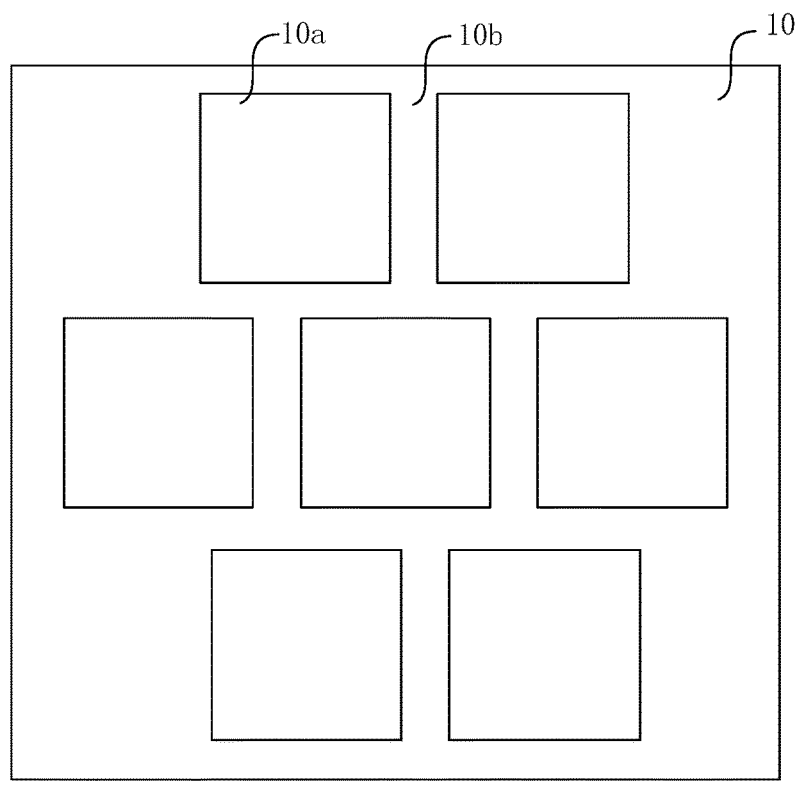
FIG. 2 to FIG. 8 are schematic diagrams illustrating intermediate structures corresponding to the flowchart of FIG. 1.
Figure 3:
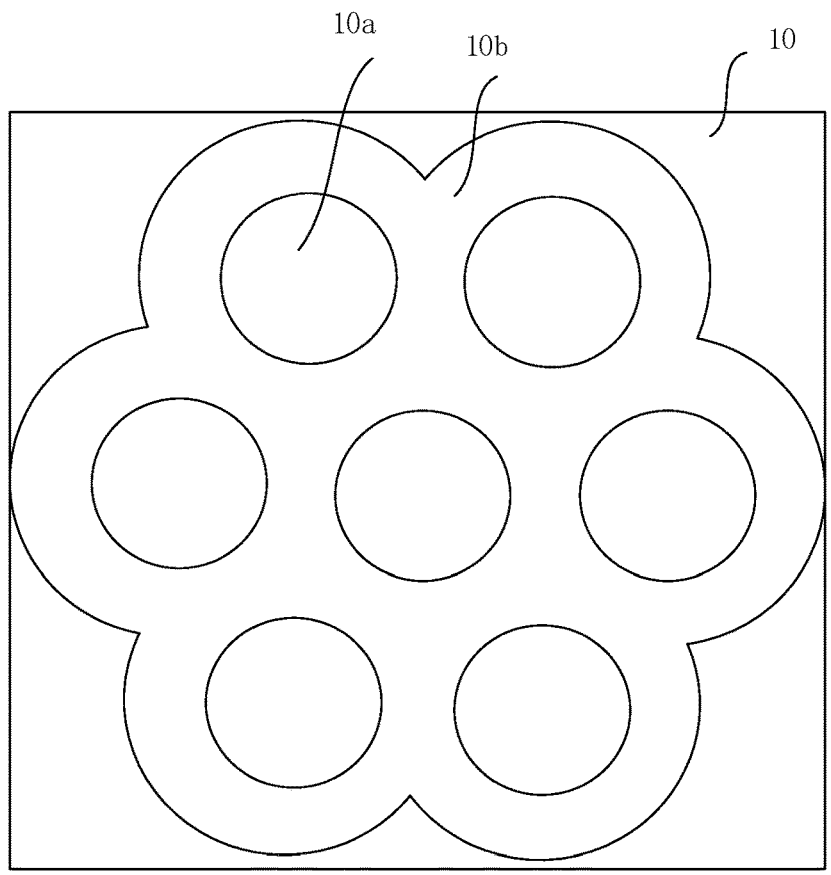

Firstly, by referring to step S1 of FIG. 1 as well as FIG. 2 and FIG. 3, a substrate 10 is provided, where the substrate 10 includes a plurality of component areas 10a and peripheral areas 10b surrounding the plurality of component areas 10a.

A material of the substrate 10 may be sapphire, silicon carbon or silicon or the like.

As shown in FIG. 2 and FIG. 3, six component areas 10a adjacent to one component area 10a are arranged into a regular hexagon. In another embodiment, the component areas 10a may also be arranged in another manner.

As shown in FIG. 2, the component area 10a may be rectangular and the peripheral area 10b corresponding to the component area 10a is a rectangular ring. As shown in FIG. 3, the component area 10a may also be circular and the peripheral area 10b corresponding to the component area 10a may also be a circular ring. In another embodiment, the component area 10a may also be other polygon than rectangle, or even an ellipse. The shapes of the component area 10a and the peripheral area 10b are not limited in the present disclosure.

As shown in FIG. 2 to FIG. 3, the peripheral areas 10b of various component areas 10a may be connected together.

Figure 4:
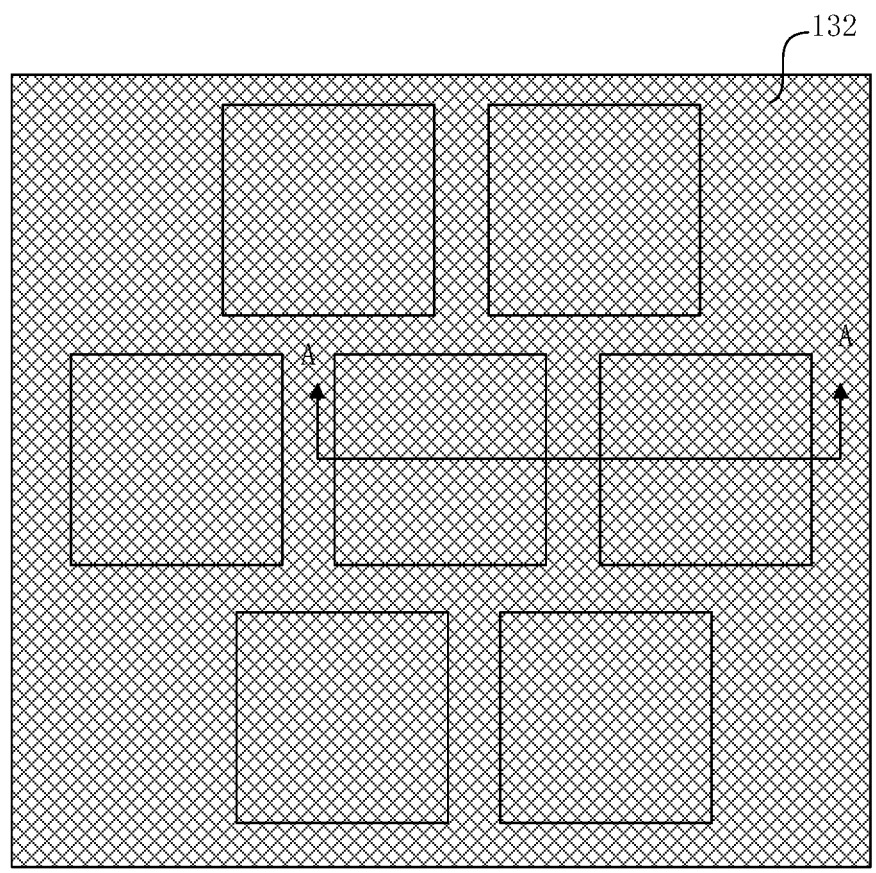
Figure 5:
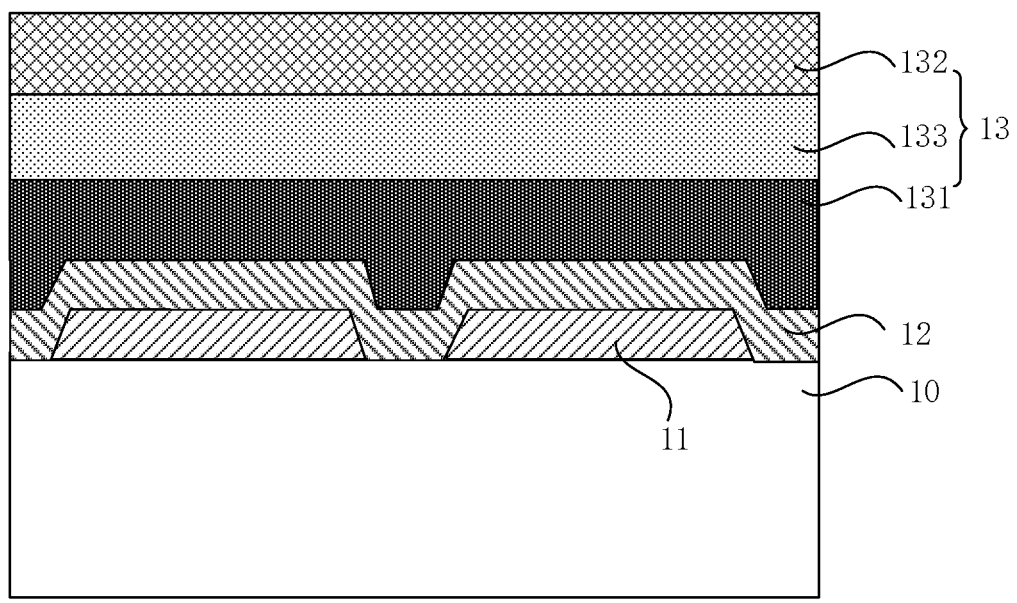

FIG. 5 is a sectional view taken along a line AA in FIG. 4. Next, by referring to step S2 of FIG. 1 and FIG. 5, a sacrificial layer 11 is formed on the substrate 10, and the sacrificial layer 11 is patterned such that the sacrificial layer 11 on the component areas 10a is at least remained.

A material of the sacrificial layer 11 may include at least one of silicon dioxide, silicon nitride or silicon oxynitride, and the sacrificial layer 11 is formed by adopting corresponding physical vapor deposition or chemical vapor deposition. The sacrificial layer 11 may be patterned by dry etch or wet etch.

In an embodiment shown in FIG. 5, when the sacrificial layer 11 is patterned, only the sacrificial layer 11 on the component area 10a is remained.

Figure 6:
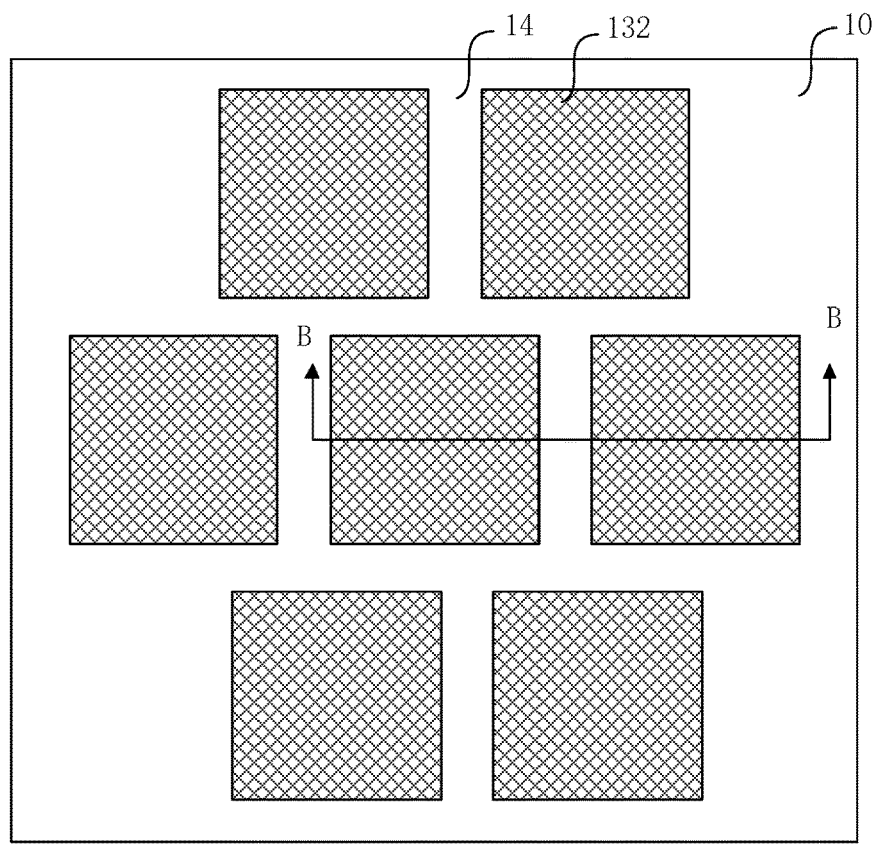
Figure 7:
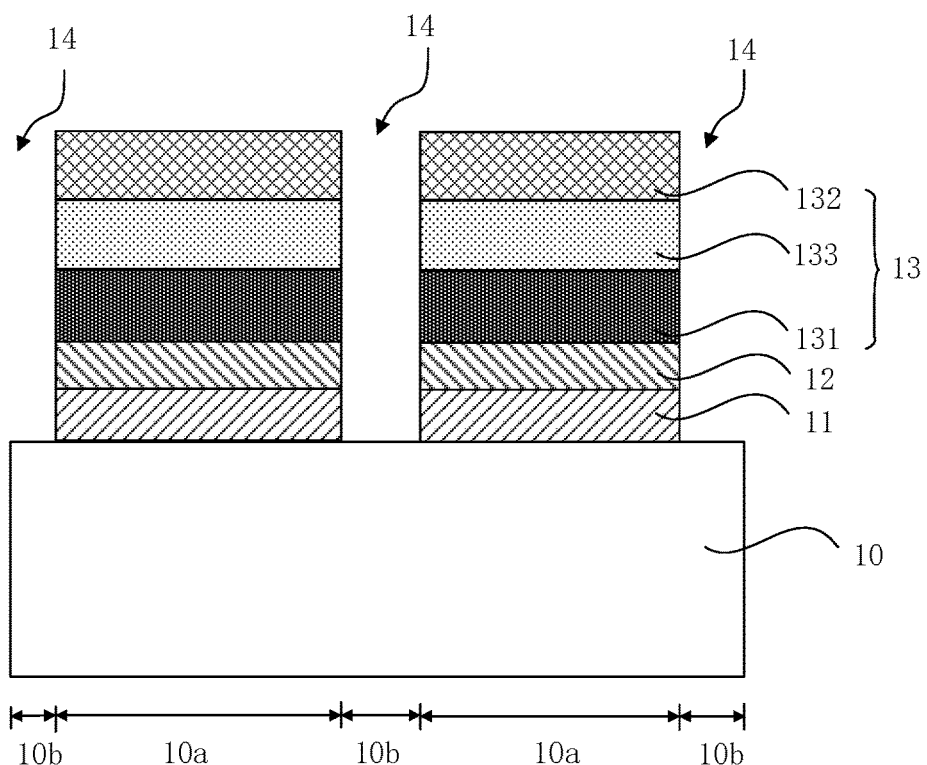

Afterwards, by referring to step S3 of FIG. 1 and FIG. 5, a semiconductor active layer 13 is formed on the sacrificial layer 11 and the substrate 10. By referring to FIG. 6 and FIG. 7, the semiconductor active layer 13 is patterned to remove the semiconductor active layers 13 in the peripheral areas 10b so as to form a plurality of annular grooves 14, such that the semiconductor active layer 13 on each of the component areas 10a is independent. FIG. 7 is a sectional view taken along a line BB in FIG. 6.

In an optional embodiment, forming the semiconductor active layer 13 on the sacrificial layer 11 and the substrate 10 includes: firstly, forming a transition layer 12 on the sacrificial layer 11 and the substrate 10, and then forming the semiconductor active layer 13 on the transition layer 12.

A material of the transition layer 12 may include at least one of AlN, SiAlN or AlGaN. The transition layer 12 helps to improve a crystal quality of the subsequent semiconductor active layer 13. Illustratively, the transition layer 12 may be formed by firstly adopting Physical Vapor Deposition (PVD) and then Metal-Organic Chemical Vapor Deposition (MOCVD); or formed by epitaxial lateral overgrowth.

In an optional embodiment, high temperature annealing may also be performed for the transition layer 12 to enable the transition layer 12 to form a mono-crystalline material, thus the crystal quality of the semiconductor active layer 13 is further improved. Specifically, for example, the transition layer 12 is prepared in a PVD device and then subjected to high temperature annealing in the MOCVD device, thereby a high-quality mono-crystalline transition layer 12 is obtained.

The semiconductor active layer 13 may include a GaN-based material which includes at least one of GaN, AlGaN or AlInGaN.

The GaN-based material may be formed by the following process: Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), or MOCVD or a combination thereof.

In an embodiment shown in FIG. 5, the semiconductor active layer 13 includes a P type semiconductor layer 131, an N type semiconductor layer 132, and a light-emitting material layer 133 disposed between the P type semiconductor layer 131 and the N type semiconductor layer 132. In other words, the semiconductor active layer 13 forms an LED component. In another optional embodiment, the semiconductor active layer 13 may also form another semiconductor structure, which is not limited in the present disclosure.

When the semiconductor active layer 13 is patterned, the transition layer 12 is also patterned. The semiconductor active layer 13 and the transition layer 12 may be patterned by dry etch or wet etch. With reference to FIG. 6 and FIG. 7, the patterning of the semiconductor active layer 13 and the transition layer 12 aims to, for example, expose a sidewall of the sacrificial layer 11 on the component areas 10a in the annular groove 14.

Figure 8:
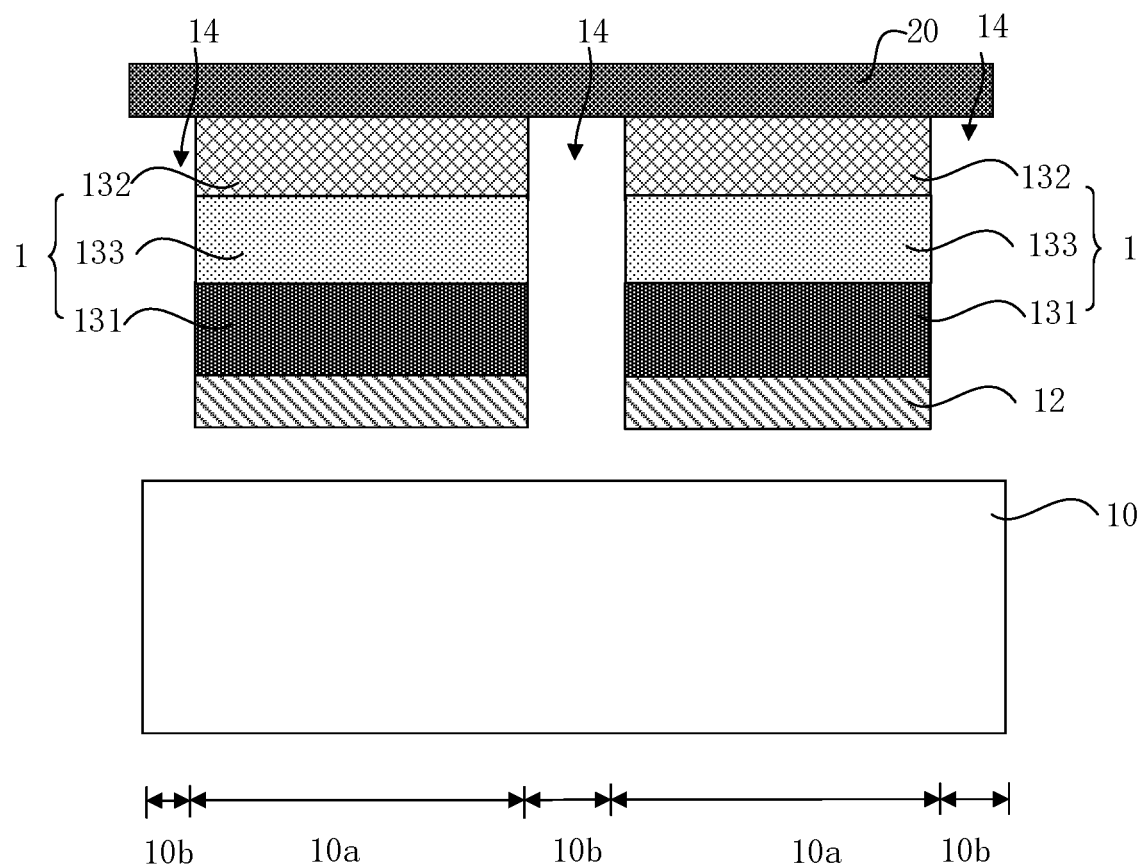

Afterwards, by referring to step S4 of FIG. 1, FIG. 7 and FIG. 8, the sacrificial layer 11 on each of the component areas 10a is removed through the annular grooves 14 to separate the independent semiconductor active layer 13 on each of the component areas 10a from the substrate 10, where each independent semiconductor active layer 13 forms a semiconductor structure 1.

The removal of the sacrificial layer 11 of each of the component areas 10a may be achieved by dry etch or wet etch.

When a material of the sacrificial layer 11 is silicon dioxide, silicon nitride or silicon oxynitride, a dry etch gas may be CF4 or C3F8 or the like. Because the material of the sacrificial layer 11 is different from that of the semiconductor active layer 13, it can be guaranteed by adopting a dry etch gas having a high etch selectivity for the sacrificial layer 11 that the semiconductor active layer 13 of the component areas 10a will be protected against being damaged while the sacrificial layer 11 is removed.

One independent semiconductor active layer 13 is used to form one semiconductor structure 1.

In an embodiment having a transition layer 12, the transition layer 12 and the semiconductor active layer 13 may form a semiconductor structure 1 together.

In an optional embodiment, as shown in FIG. 8, a carrier plate 20 is disposed on the semiconductor active layers 13 of at least some of the component areas 10a at the end of the process of removing the sacrificial layer 11 by dry etch; then, some or all semiconductor structures 1 are transferred to the carrier plate 20 in a mechanical breaking manner as required. In another optional embodiment, a carrier plate 20 may also be disposed on each independent semiconductor active layer 13 after the sacrificial layer 12 is removed by dry etch.

When the material of the sacrificial layer 11 is silicon dioxide or silicon oxynitride, a wet etch solution may be HF acid; when the material of the sacrificial layer 11 is silicon nitride, the wet etch solution may be hot phosphoric acid.

In an optional embodiment, as shown in FIG. 2 and FIG. 3, when various peripheral areas 10b are connected and at least one peripheral area 10b is located at a sidewall of the substrate 10, that is, exposed to outside, a carrier plate 20 is disposed on the semiconductor active layers 13 in at least some of the component areas 10a before the sacrificial layer 11 on each component area 10a is removed by wet etch. In this optional embodiment, the semiconductor structure provided with the carrier plate 20 is placed in a wet etch solution, and the wet etch solution starts corroding the sacrificial layer 11 on each of the component area 10a through the sidewall of the substrate 10 until each independent semiconductor active layer 13 (and transition layer 12) is separated from the substrate 10.

It can be seen that a plurality of semiconductor structures 1 can be manufactured by removing the sacrificial layer 11 at the same time. In this way, a large batch of semiconductor structures 1 can be manufactured at the same time with low costs. Furthermore, because the material of the sacrificial layer 11 is different from that of the semiconductor active layer 13, the substrate 10 can be peeled off by removing the sacrificial layer 11, thus the good peeling quality is realized. Further, there is no thermal process in the peeling process, and hence the semiconductor active layer 13 will not be damaged.

Figure 9:
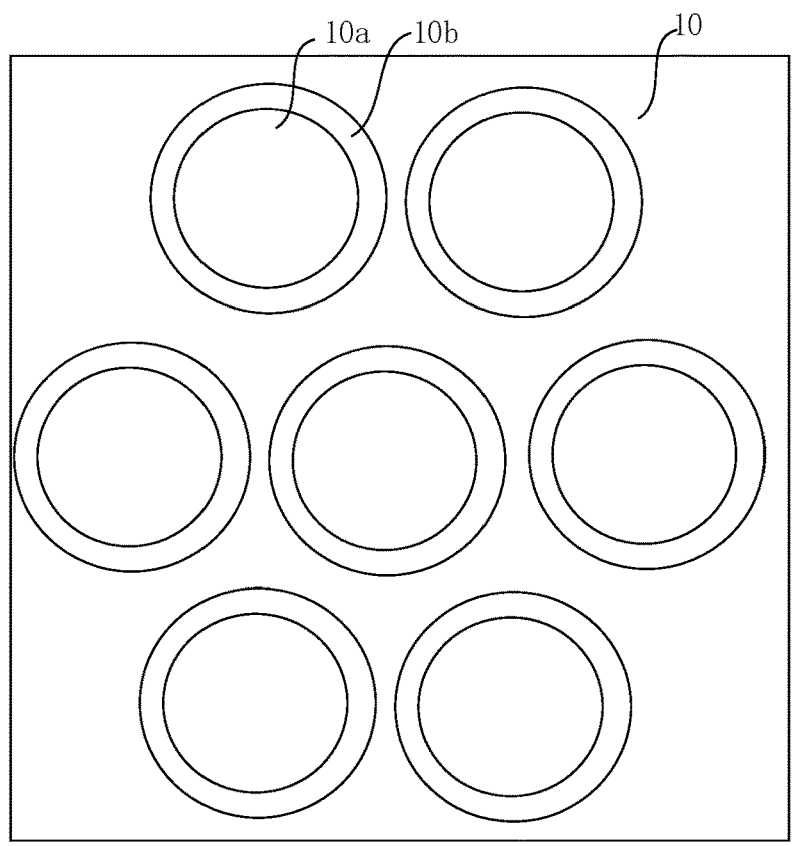
FIG. 9 to FIG. 11 are schematic diagrams illustrating intermediate structures corresponding to a method of manufacturing a semiconductor structure according to a second embodiment of the present disclosure.
Figure 10:
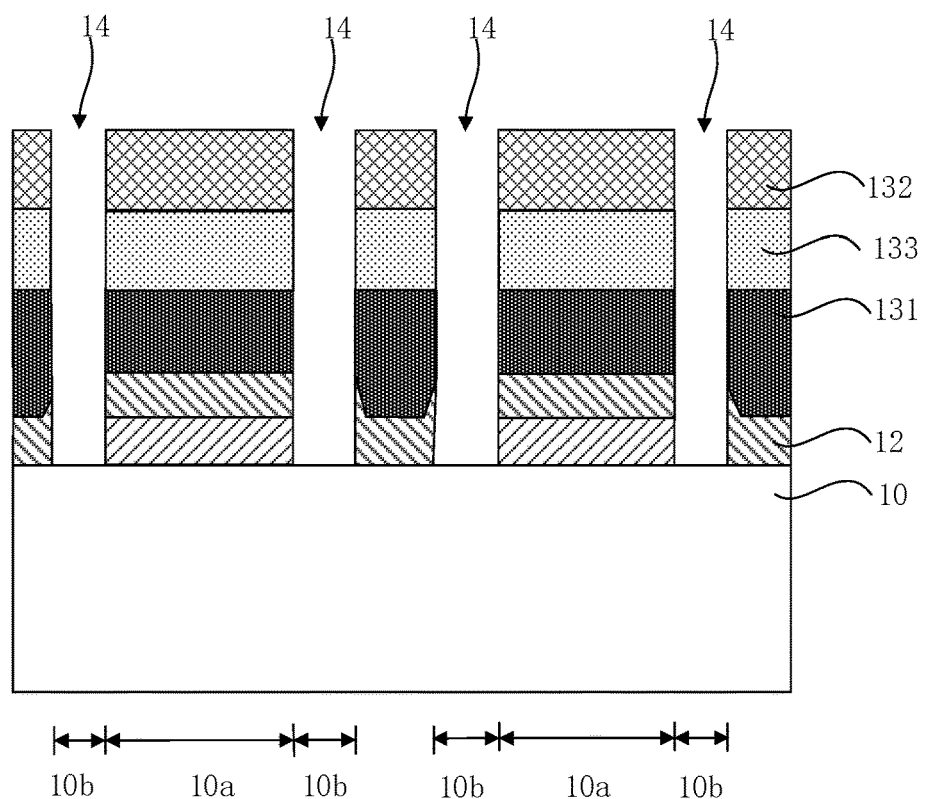
Figure 11:
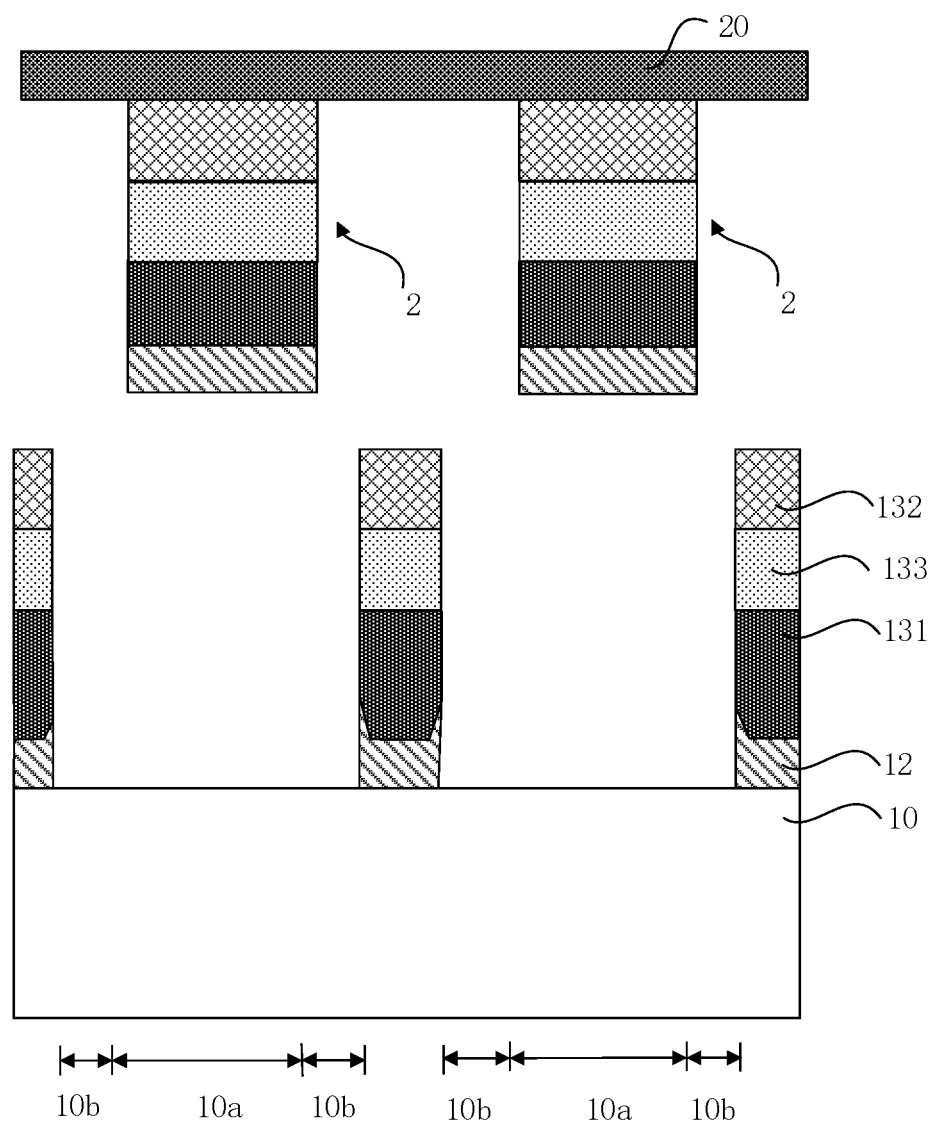

FIG. 9 to FIG. 11 are schematic diagrams illustrating intermediate structures corresponding to a method of manufacturing a semiconductor structure according to a second embodiment of the present disclosure. As shown in FIG. 9 to FIG. 11, the method of manufacturing a semiconductor structure 2 in the second embodiment is basically identical to the method of manufacturing a semiconductor structure 1 in the first embodiment, except that: at step S1, the peripheral areas 10b of various component areas 10a are not connected with each other; at step S5, the carrier plate 20 is disposed on the semiconductor active layer 13 on each of the component areas 10a only at the end of, or subsequent to, the process of removing the sacrificial layer 11, regardless of whether the sacrificial layer 11 of each of the component areas 10a is removed by dry etch or wet etch.

In another embodiment, the peripheral areas 10b of some component areas 10a may be connected together; and the peripheral areas 10b of other component areas 10a are not connected with each other.

Figure 12:
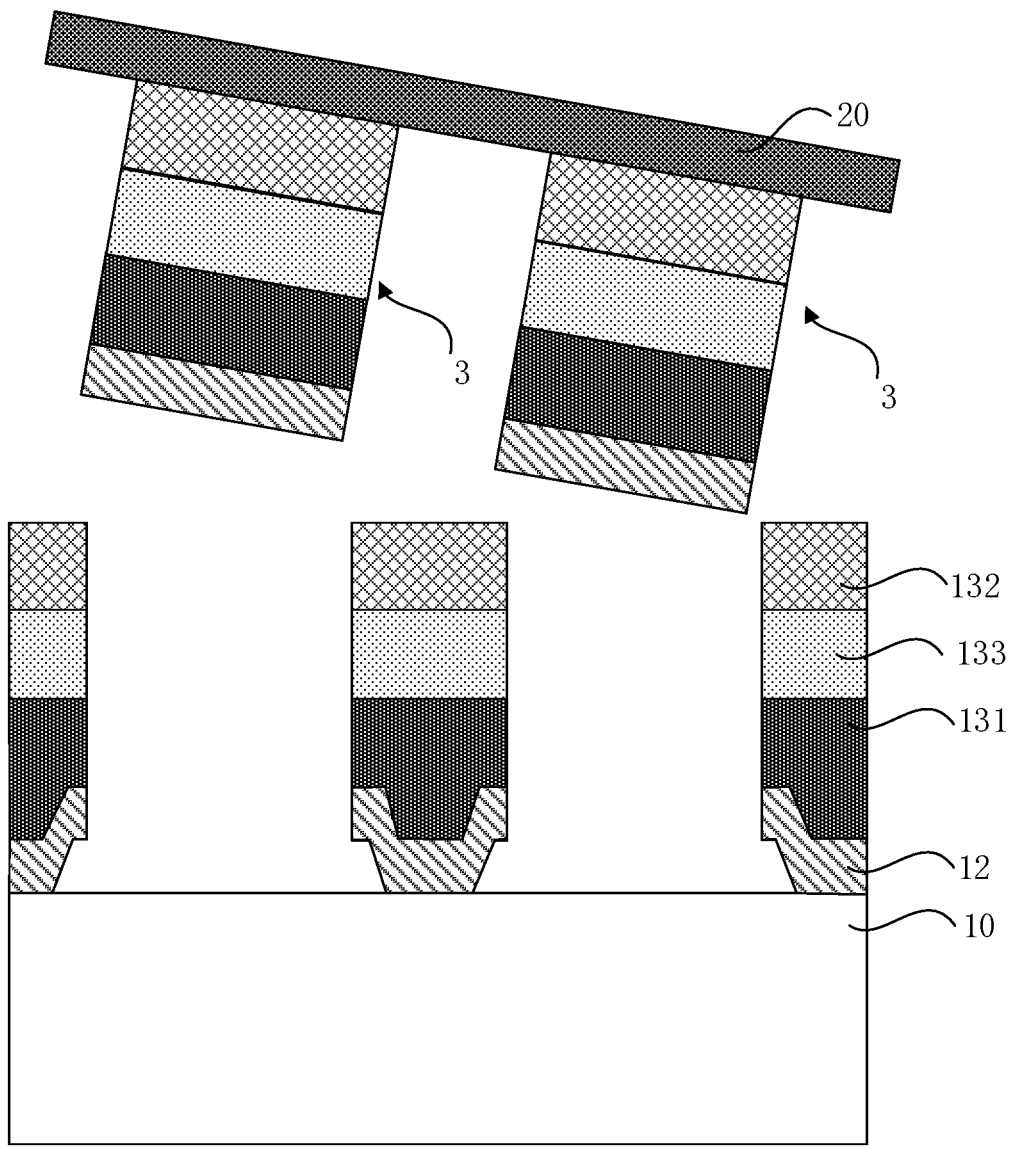
FIG. 12 is a schematic diagram illustrating an intermediate structure corresponding to a method of manufacturing a semiconductor structure according to a third embodiment of the present disclosure.

FIG. 12 is a schematic diagram illustrating an intermediate structure corresponding to a method of manufacturing a semiconductor structure according to a third embodiment of the present disclosure. As shown in FIG. 12, the method of manufacturing a semiconductor structure 3 in the third embodiment is basically identical to the methods of manufacturing semiconductor structures 1, 2 in the first and second embodiments, except that: at step S2, when the sacrificial layer 11 is patterned, the remaining sacrificial layer 11 extends from the each of the component areas 10a to the peripheral areas 10b; at step S4, when the semiconductor active layer 13 (and the transition layer 12) is patterned, the sacrificial layer 11 in each of the peripheral areas 10b is further removed, or the annular grooves 14 expose the sacrificial layer 11 of the peripheral areas 10b.

The manufacturing method of the present disclosure is simple in operation and low in costs, and can be applied to manufacture of elements with different size requirements, for example, to manufacture of an LED element of above 200 μm, or below 50 μm including LED elements of 2-15 μm.

Although the disclosure is made as above, the present disclosure is not limited hereto. Those skilled in the art may make various changes and modifications without departing from the spirit and scope of the present disclosure. Therefore, the scope of protection of the present disclosure shall be indicated in the appended claims.

The invention claimed is:

1. A method of manufacturing a semiconductor structure, comprising:
    providing a substrate, wherein the substrate comprises a plurality of component areas and peripheral areas surrounding the plurality of component areas;
    forming a sacrificial layer on the substrate and patterning the sacrificial layer to obtain a remaining sacrificial layer on each of the plurality of component areas;
    forming a semiconductor active layer on the remaining sacrificial layer on each of the plurality of component areas and the substrate, and patterning the semiconductor active layer to remove semiconductor active layer in the peripheral areas so as to form a plurality of annular grooves and obtain remaining semiconductor active layers, spaced from each other by the plurality of annular grooves, on the plurality of component areas, and a sidewall of the remaining sacrificial layer on each of the plurality of component areas is exposed in the annular grooves;
    removing the remaining sacrificial layer on each of the plurality of component areas through the annular grooves, such that a remaining semiconductor active layer on each of the plurality of component areas is separated from the substrate, wherein the remaining semiconductor active layer on each of the component areas that is independent forms a semiconductor structure.

2. The method of claim 1, wherein the remaining sacrificial layer on each of the plurality of component areas is removed by dry etch or wet etch.

3. The method of claim 1, wherein the peripheral areas are integrated.

4. The method of claim 1, wherein forming the semiconductor active layer on the remaining sacrificial layer on each of the plurality of component areas and the substrate comprises:
    forming a transition layer on the remaining sacrificial layer on each of the plurality of component areas and the substrate, and
    forming the semiconductor active layer on the transition layer; wherein the semiconductor active layer and the transition layer is are patterned together.

5. The method of claim 4, wherein before the semiconductor active layer is formed, annealing is performed for the transition layer such that the transition layer is a monocrystalline material.

6. The method of claim 1, wherein a carrier plate is disposed on at least some of the remaining semiconductor active layers on the plurality of component areas after the semiconductor active layer is patterned.

7. The method of claim 1, wherein a plan view of the remaining semiconductor active layer on each of the plurality of component areas is polygonal; or, the plan view of the remaining semiconductor active layer on each of the plurality of component areas is circular or elliptical.

8. The method of claim 1, wherein the semiconductor active layer comprises a GaN-based material.

9. The method of claim 1, wherein a material of the sacrificial layer comprises at least one of silicon dioxide, silicon nitride or silicon oxynitride.

10. The method of claim 1, wherein the semiconductor active layer comprises a P type semiconductor layer, an N type semiconductor layer, and a light-emitting material layer disposed between the P type semiconductor layer and the N type semiconductor layer.

* * * * *